(12) United States Patent
Shiah et al.

(10) Patent No.: US 7,940,093 B2
(45) Date of Patent: May 10, 2011

(54) OUTPUT CIRCUIT WITH OVERSHOOT-REDUCING FUNCTION

(75) Inventors: Chun Shiah, Hsinchu (TW); Chi-Fa Lien, Taipei County (TW); Sen-Fu Hong, Tainan (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 12/246,479

(22) Filed: Oct. 6, 2008

(65) Prior Publication Data
US 2009/0201068 A1    Aug. 13, 2009

(30) Foreign Application Priority Data

Feb. 13, 2008 (TW) .............................. 97105027 A (51) Int. Cl.
*H03K 3/00* (2006.01)
(52) U.S. Cl. ........................................................ 327/112
(58) Field of Classification Search .................... 327/112
See application file for complete search history.

(56) References Cited

U.S. PATENT DOCUMENTS

| | | | | |
|---|---|---|---|---|
| 5,894,238 A | * | 4/1999 | Chien | 327/112 |
| 7,598,784 B2 | * | 10/2009 | Hunter | 327/170 |
| 2001/0026178 A1 | * | 10/2001 | Itoh et al. | 327/112 |
| 2003/0164723 A1 | * | 9/2003 | Suzuki | 327/112 |

* cited by examiner

*Primary Examiner* — Lincoln Donovan
*Assistant Examiner* — Khareem E Almo
(74) *Attorney, Agent, or Firm* — Winston Hsu; Scott Margo (57) ABSTRACT

Output circuit with reduced overshoot includes input end, output end, a circuit composed of PMOS and NMOS, rising and falling edge trigger bias circuits. The rising and falling edge trigger bias circuits output biasing voltages to the output end for clamping the voltage of the output signals respectively according to the rising edge and the falling edge of the input signal. In this way, the overshoot of the output signal is reduced.

9 Claims, 7 Drawing Sheets

OUTPUT CIRCUIT WITH OVERSHOOT-REDUCING FUNCTION

BACKGROUND OF THE INVENTION

1. Field of the Invention

The present invention relates to an output circuit, and more particularly, to an output circuit with overshoot-reducing function.

2. Description of the Prior Art

Figure 1:
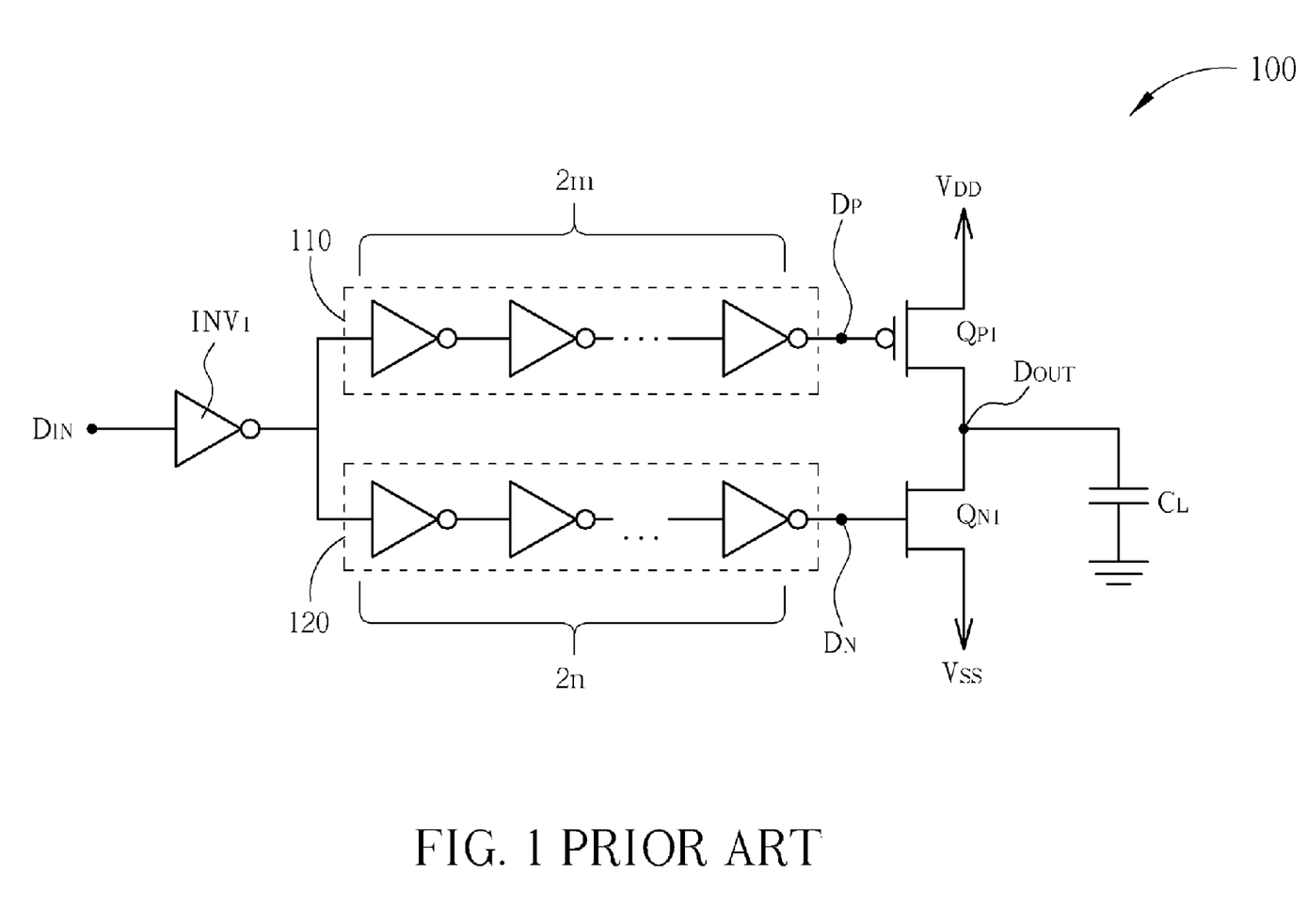
FIG. 1 is a diagram illustrating a conventional output circuit.

Please refer to FIG. 1. FIG. 1 is a diagram illustrating a conventional output circuit 100. The output circuit 100 comprises an input end, an output end, an inverter $INV_1$, delay circuits 110 and 120, PMOS $QP_1$, and NMOS $QN_1$.

The input end of the output circuit 100 receives an input signal $D_{IN}$. The output end of the output circuit 100 outputs an output signal $D_{OUT}$. It is assumed that the output end of the output circuit 100 is equivalently coupled to a capacitor $C_L$.

The PMOS $Q_{P1}$ comprises a first end, a second end, and a control end. The NMOS $Q_{N1}$ comprises a first end, a second end, and a control end. The inverter $INV_1$ is coupled between the input end of the output circuit 100, and the delay circuits 110 and 120. The delay circuit 110 is coupled between the inverter $INV_1$ and the control end of the PMOS $Q_{P1}$. The delay circuit 120 is coupled between the inverter $INV_1$ and the control end of the NMOS $Q_{N1}$. The first end of the PMOS $Q_{P1}$ is coupled to a voltage source $V_{DD}$ (supplying a voltage $V_{DD}$), the second end of the PMOS $Q_{P1}$ is coupled to the output end of the output circuit 100, and the control end of the PMOS $Q_{P1}$ is coupled to the delay circuit 110. The first end of the NMOS $Q_{N1}$ is coupled to a voltage source $V_{SS}$ (supply a voltage $V_{SS}$), the second of the NMOS $Q_{N1}$ is coupled to the output end of the output circuit 100, and the control end of the NMOS $Q_{N1}$ is coupled to the delay circuit 120.

The inverter $INV_1$ is disposed for receiving the input signal $D_{IN}$, inverting the received input signal $D_{IN}$, and outputting the inverted input signal $D_{IN}$.

The delay circuit 110 is coupled between the inverter $INV_1$ and the control end of the PMOS $Q_{P1}$ for receiving the inverted input signal $D_{IN}$, delaying the received inverted input signal $D_{IN}$ for a predetermined period $DL_1$, and then inputting the delayed input signal $D_{IN}$ to the control end of the PMOS $Q_{P1}$ (the node $D_P$). The delay circuit 110 can be realized with an even number of the inverters coupled in series (the even number is "2m" as shown in FIG. 1) for delaying the predetermined period $DL_1$.

The delay circuit 120 is coupled between the inverter $INV_1$ and the control end of the NMOS $Q_{N1}$ for receiving the inverted input signal $D_{IN}$, delaying the received inverted input signal $D_{IN}$ for a predetermined period $DL_2$, and then inputting the delayed input signal $D_{IN}$ to the control end of the NMOS $Q_{N1}$ (the node $D_N$). The delay circuit 120 can be realized with an even number of the inverters coupled in series (the even number is "2n" as shown in FIG. 1) for delaying the predetermined period $DL_2$.

The voltage $V_{DD}$ can be a high voltage, and the voltage $V_{SS}$ can be ground.

Additionally, the delay periods $DL_1$ and $DL_2$ are different, which means the numbers "2m" and "2n" of the inverters are different. The difference between the delay periods $DL_1$ and $DL_2$ avoids the PMOS $Q_{P1}$ and the NMOS $Q_{N1}$ being both turned on at the same time, which generates the current flows from the voltage source $V_{DD}$ directly to the voltage source $V_{SS}$.

Figure 2:
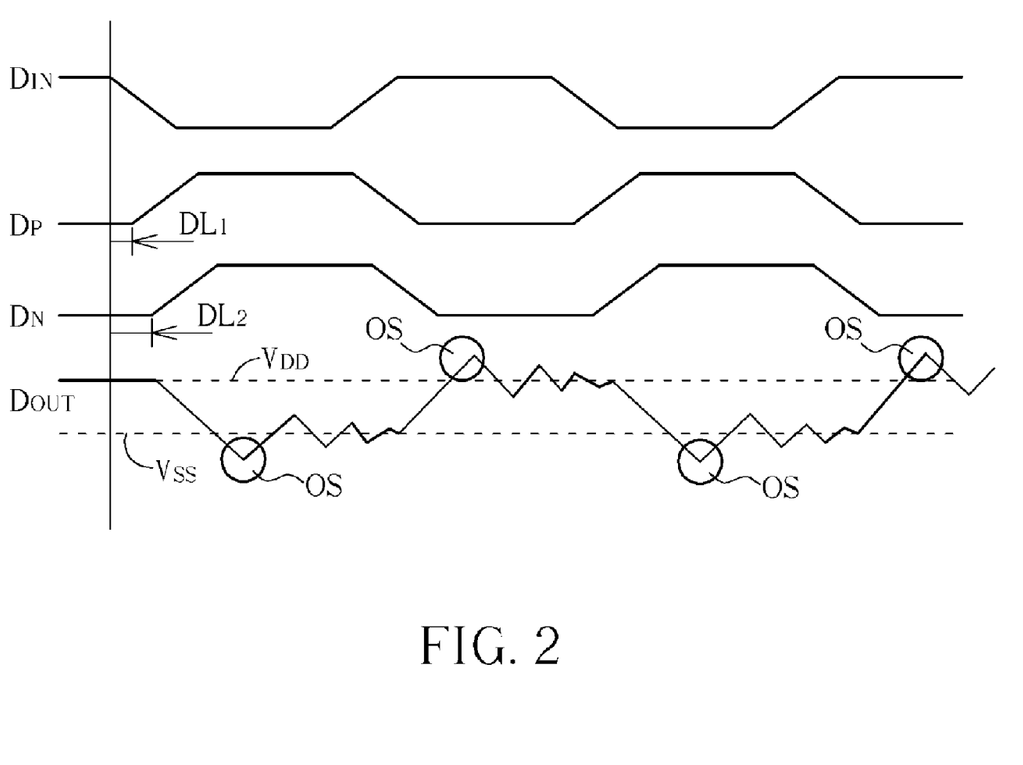
FIG. 2 is a timing diagram illustrating the conventional output circuit.

Please refer to FIG. 2. FIG. 2 is a timing diagram illustrating the conventional output circuit 100. As shown in FIG. 2, after the input signal $D_{IN}$ is inputted, on the node $D_P$, the signal inverted from the input signal $D_{IN}$ and delayed for the predetermined period $DL_1$ is generated and inputted to the PMOS $Q_{P1}$. Meanwhile, on the node $D_N$, the signal inverted from the input signal $D_{IN}$ and delayed for the predetermined period $DL_2$ is generated and inputted to the NMOS $Q_{N1}$. In this way, the output signal $D_{OUT}$ is generated by the PMOS $Q_{P1}$ and the NMOS $Q_{N1}$. When the input signal $D_{IN}$ is in a transient status (for example, in the period of the voltage of the signal $D_{IN}$ changing from a high voltage to a low voltage, or vice versa), the voltage of the output signal $D_{OUT}$ possibly rises over the voltage $V_{DD}$ or falls over the voltage $V_{SS}$, which is so-called overshoot, and damages the components in the circuit.

A conventional method for reducing the overshoot problem is to couple a capacitor to the output end of the output circuit 100. However, the capacitor on the output end lowers the slew rate of the output signal $D_{OUT}$, and consequently the access speed of the output circuit 100 is also lowered. As the speed of internal components of systems increases, the demand for the speed of the memory is also increased. It is not satisfying the demand with just purely raising the frequency of the clock signal of the memories, and therefore the technologies of the Synchronous Dynamic Random Access Memory (SRAM), the Double Data Rate (DDR), and the second generation of the DDR (DDR2) have to be utilized to meet the demand. The frequencies of dies of the conventional memories equal to the frequencies of the input/output buffers (I/O buffers). However, the frequencies of the I/O buffers of the memories of the DDR2 technology is doubled than the frequencies of the cores of the memories. The method with adding capacitors to the output ends for reducing overshoots lowers the speed of the output circuit of the memory.

Therefore, it is important to provide an innovative technology of Off-Chip Driver (OCD) with voltage-regulating circuits to reduce overshoots when the output circuit charges/discharges.

SUMMARY OF THE INVENTION

The present invention provides an output circuit with overshoot-reducing function. The output circuit comprises an input end for receiving an input signal; an output end; a PMOS comprising a first end coupled to a first voltage source supplying a first voltage; a control end coupled to the input end; and a second end coupled to the output end; an NMOS comprising a first end coupled to a second voltage source supplying a second voltage; a control end coupled to the input end; and a second end coupled to the output end; a rising-edge trigger biasing circuit coupled between the input end and the output end for outputting a third voltage to the output end so as to reduce overshoot on the output end according to a rising edge of the input signal; and a falling-edge trigger biasing circuit coupled between the input end and the output end for outputting a fourth voltage to the output end so as to reduce overshoot on the output end according to a falling edge of the input signal; wherein the third voltage is higher than the second voltage, and the fourth voltage is lower than the first voltage.

The present invention further provides an output circuit with overshoot-reducing function. The output circuit comprises an input end for receiving an input signal; an output end; a first switch coupled between a first voltage source supplying a first voltage and the output end for coupling the first voltage source to the output end; a second switch coupled between a second voltage source supplying a second voltage and the output end for coupling the second voltage source to the output end; a first trigger biasing circuit coupled between the input end, the output end and a third voltage source supplying a third voltage for outputting the third voltage to the output end according to a first status of the input signal; and a second trigger biasing circuit coupled between the input end, the output end and a fourth voltage source supplying a fourth voltage for outputting the fourth voltage to the output end according to a second status of the input signal; wherein the second switch is turned for coupling the second voltage source to the output end only after the first trigger biasing circuit outputs the third voltage to the output end for a first predetermined period, and the third voltage is different from the second voltage.

The present invention further provides an output circuit with overshoot-reducing function. The output circuit comprises an input end for receiving an input signal; an output end; a first control device coupled between a first voltage source supplying a first predetermined voltage and the output end for coupling the first voltage source to the output end; and a second control device coupled between a second voltage source supplying a second predetermined voltage and the output end for coupling the second voltage source to the output end; wherein the first control device couples the first voltage source to the output end only after the second control device outputs the second predetermined voltage to the output end for a first predetermined period, and the first predetermined voltage is different from the second predetermined voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
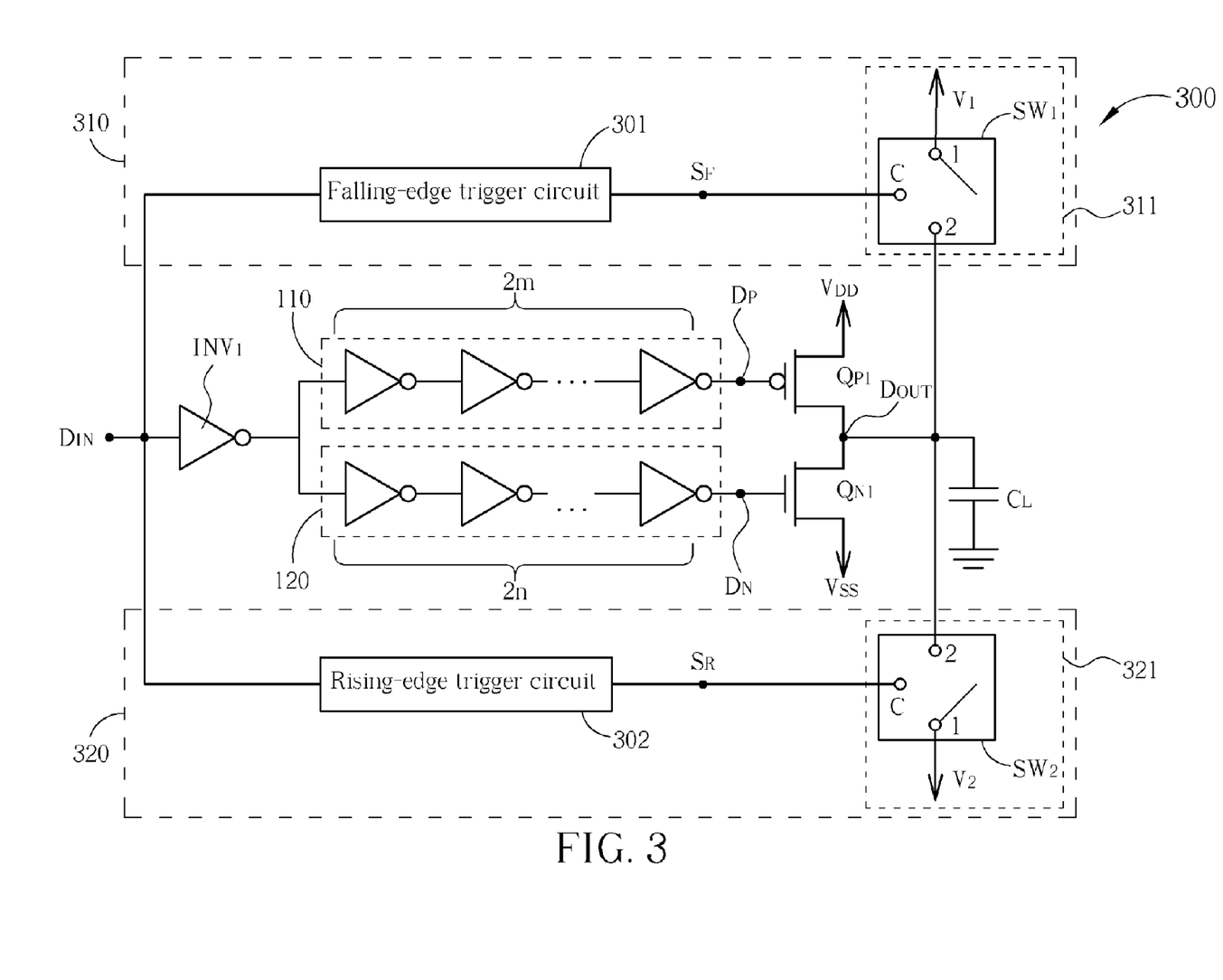
FIG. 3 is a diagram illustrating the output circuit of the present invention.

Please refer to FIG. 3. FIG. 3 is a diagram illustrating the output circuit 300 of the present invention. The output circuit 300 comprises an input end, an output end, an inverter INV1, delay circuits 110 and 120, PMOS QP1, NMOS QN1, a falling-edge trigger biasing circuit 310, and a rising-edge trigger biasing circuit 320.

The input end of the output circuit 300 receives an input signal $D_{IN}$. The output end of the output circuit 300 outputs an output signal $D_{OUT}$. It is assumed that the output end of the output circuit 300 is equivalently coupled to a capacitor $C_L$.

The PMOS $Q_{P1}$ comprises a first end, a second end, and a control end. The NMOS $Q_{N1}$ comprises a first end, a second end, and a control end. The inverter $INV_1$ is coupled between the input end of the output circuit 100, and the delay circuits 110 and 120. The delay circuit 110 is coupled between the inverter $INV_1$ and the control end of the PMOS $Q_{P1}$. The delay circuit 120 is coupled between the inverter $INV_1$ and the control end of the NMOS $Q_{N1}$. The first end of the PMOS $Q_{P1}$ is coupled to a voltage source $V_{DD}$ (supplying a voltage $V_{DD}$), the second end of the PMOS $Q_{P1}$ is coupled to the output end of the output circuit 300, and the control end of the PMOS $Q_{P1}$ is coupled to the delay circuit 110. The first end of the NMOS $Q_{N1}$ is coupled to a voltage source $V_{SS}$ (supply a voltage $V_{SS}$), the second of the NMOS $Q_{N1}$ is coupled to the output end of the output circuit 300, and the control end of the NMOS $Q_{N1}$ is coupled to the delay circuit 120. The falling-edge trigger biasing circuit comprises a falling-edge trigger circuit 301 and a biasing circuit 311. The falling-edge trigger circuit 301 is coupled between the input end of the output circuit 300 and the biasing circuit 311. The biasing circuit 311 is coupled between the falling-edge trigger circuit 301 and the output end of the output circuit 300. The rising-edge trigger biasing circuit comprises a rising-edge trigger circuit 302 and a biasing circuit 321. The rising-edge trigger circuit 302 is coupled between the input end of the output circuit 300 and the biasing circuit 321. The biasing circuit 321 is coupled between the rising-edge trigger circuit 302 and the output end of the output circuit 300. The biasing circuit 311 comprises a switch $SW_1$ and a voltage source $V_1$ supplying a voltage $V_1$. The switch $SW_1$ comprises a first end 1, a second end 2, and a control end C. The first end 1 of the switch $SW_1$ is coupled to the voltage source $V_1$, the second end 2 of the switch $SW_1$ is coupled to the output end of the output circuit 300, and the control end C of the switch $SW_1$ is coupled to the falling-edge trigger circuit 301. The biasing circuit 321 comprises a switch $SW_2$ and a voltage source $V_2$ supplying a voltage $V_2$. The switch $SW_2$ comprises a first end 1, a second end 2, and a control end C. The first end 1 of the switch $SW_2$ is coupled to the voltage source $V_2$, the second end 2 of the switch $SW_2$ is coupled to the output end of the output circuit 300, and the control end C of the switch $SW_2$ is coupled to the rising-edge trigger circuit 302.

The inverter $INV_1$ is disposed for receiving the input signal $D_{IN}$, inverting the received input signal $D_{IN}$, and outputting the inverted input signal $D_{IN}$.

The delay circuit 110 is coupled between the inverter $INV_1$ and the control end of the PMOS $Q_{P1}$ for receiving the inverted input signal $D_{IN}$, delaying the received inverted input signal $D_{IN}$ for a predetermined period $DL_1$, and then inputting the delayed input signal $D_{IN}$ to the control end of the PMOS $Q_{P1}$ (the node $D_P$). The delay circuit 110 can be realized with an even number of the inverters coupled in series (the even number is "2m" as shown in FIG. 1) for delaying the predetermined period $DL_1$.

The delay circuit 120 is coupled between the inverter $INV_1$ and the control end of the NMOS $Q_{N1}$ for receiving the inverted input signal $D_{IN}$, delaying the received inverted input signal $D_{IN}$ for a predetermined period $DL_2$, and then inputting the delayed input signal $D_{IN}$ to the control end of the NMOS $Q_{N1}$ (the node $D_N$). The delay circuit 120 can be realized with an even number of the inverters coupled in series (the even number is "2n" as shown in FIG. 1) for delaying the predetermined period $DL_2$.

The voltage $V_{DD}$ can be a high voltage, and the voltage $V_{SS}$ can be ground. The voltage $V_1$ is lower than the voltage $V_{DD}$ in principle, for example, the voltage $V_1$ can be in the range between the average of the voltages $V_{DD}$ and $V_{SS}$ and the voltage $V_{DD}$. The voltage $V_2$ is higher than the voltage $V_{SS}$ in principle, for example, the voltage $V_2$ can be in the range between the average of the voltages $V_{DD}$ and $V_{SS}$ and the voltage $V_{SS}$.

The falling-edge trigger circuit 301 triggers a pulse signal $P_F$ with a predetermined period on the node $S_F$ according to the input signal $D_{IN}$. More particularly, the falling-edge trigger circuit 301 triggers a pulse signal with the predetermined period $P_F$ on the node $S_F$ when the input signal $D_{IN}$ in the transient status that the voltage of the input signal $D_{IN}$ falls from the high voltage to the low voltage (falling edges). The pulse signal $P_F$ is transmitted to the control end C of the switch $SW_1$. When the switch $SW_1$ does not receive the pulse signal $P_F$, the first end 1 of the switch $SW_1$ is not coupled to the second end 2 of the switch $SW_1$. That is, the voltage source $V_1$ does not transmit the voltage $V_1$ to the output end of the output circuit 300, and thus the output signal $D_{OUT}$ is not affected. When the switch $SW_1$ receives the pulse signal $P_F$, the first end 1 of the switch $SW_1$ is coupled to the second end 2 of the switch $SW_1$. That is, the voltage source $V_1$ transmits the voltage $V_1$ to the output end of the output circuit 300, and thus the output signal $D_{OUT}$ is affected. More particularly, at the time, the output signal $D_{OUT}$ is clamped at the voltage $V_1$ for reducing the overshoots. In the conventional output circuit 100, the output signal $D_{OUT}$, at the time, steps down from the high voltage to the low voltage, which generates the overshoots. However, in the output circuit 300 of the present invention, the output signal $D_{OUT}$, at the time, is clamped at the voltage $V_1$ by the falling-edge trigger circuit 310, and the overshoots are reduced. The period of the pulse signal $P_F$ can be designed according to the periods $DL_1$ and $DL_2$. In one embodiment, the period of the pulse signal $P_F$ can be designed to be shorter than the period of the transient status of the input signal $D_{IN}$ for avoid generating the output signal $D_{OUT}$ incorrectly. In another embodiment, the period of the pulse signal $P_F$ can be designed to be longer than the entire period that the unstable overshoots are generated on the output signal $D_{OUT}$, for example, the entire period of the transient status of the input signal $D_{IN}$ changing from the high voltage to the low voltage. In this way, the overshoots on the output signal can be completely reduced.

The rising-edge trigger circuit 302 triggers a pulse signal with a predetermined period $P_R$ on the node $S_R$ according to the input signal $D_{IN}$. More particularly, the rising-edge trigger circuit 302 triggers a pulse signal $P_R$ with the predetermined period on the node $S_F$ when the input signal $D_{IN}$ in the transient status that the voltage of the input signal $D_{IN}$ rises from the low voltage to the high voltage (rising edges). The pulse signal $P_F$ is transmitted to the control end C of the switch $SW_2$. When the switch $SW_2$ does not receive the pulse signal $P_R$, the first end 1 of the switch $SW_2$ is not coupled to the second end 2 of the switch $SW_2$. That is, the voltage source $V_2$ does not transmit the voltage $V_2$ to the output end of the output circuit 300, and thus the output signal $D_{OUT}$ is not affected. When the switch $SW_2$ receives the pulse signal $P_R$, the first end 1 of the switch $SW_2$ is coupled to the second end 2 of the switch $SW_2$. That is, the voltage source $V_2$ transmits the voltage $V_2$ to the output end of the output circuit 300, and thus the output signal $D_{OUT}$ is affected. More particularly, at the time, the output signal $D_{OUT}$ is clamped at the voltage $V_2$ for reducing the overshoots. In the conventional output circuit 100, the output signal $D_{OUT}$, at the time, steps up from the low voltage to the high voltage, which generates the overshoots. However, in the output circuit 300 of the present invention, the output signal $D_{OUT}$, at the time, is clamped at the voltage $V_2$ by the rising-edge trigger circuit 320, and the overshoots are reduced. The period of the pulse signal $P_R$ can be designed according to the periods $DL_1$ and $DL_2$. In one embodiment, the period of the pulse signal $P_R$ can be designed to be shorter than the period of the transient status of the input signal $D_{IN}$ for avoid generating the output signal $D_{OUT}$ incorrectly. In another embodiment, the period of the pulse signal $P_R$ can be designed to be longer than the entire period that the unstable overshoots are generated on the output signal $D_{OUT}$, for example, the entire period of the transient status of the input signal $D_{IN}$ changing from the low voltage to the high voltage. In this way, the overshoots on the output signal can be completely reduced.

Additionally, the delay periods $DL_1$ and $DL_2$ are different, which means the numbers "2m" and "2n" of the inverters are different. The difference between the delay periods $DL_1$ and $DL_2$ avoids the PMOS $Q_{P1}$ and the NMOS $Q_{N1}$ being both turned on at the same time, which generates the current flows from the voltage source $V_{DD}$ directly to the voltage source $V_{SS}$.

Figure 4:
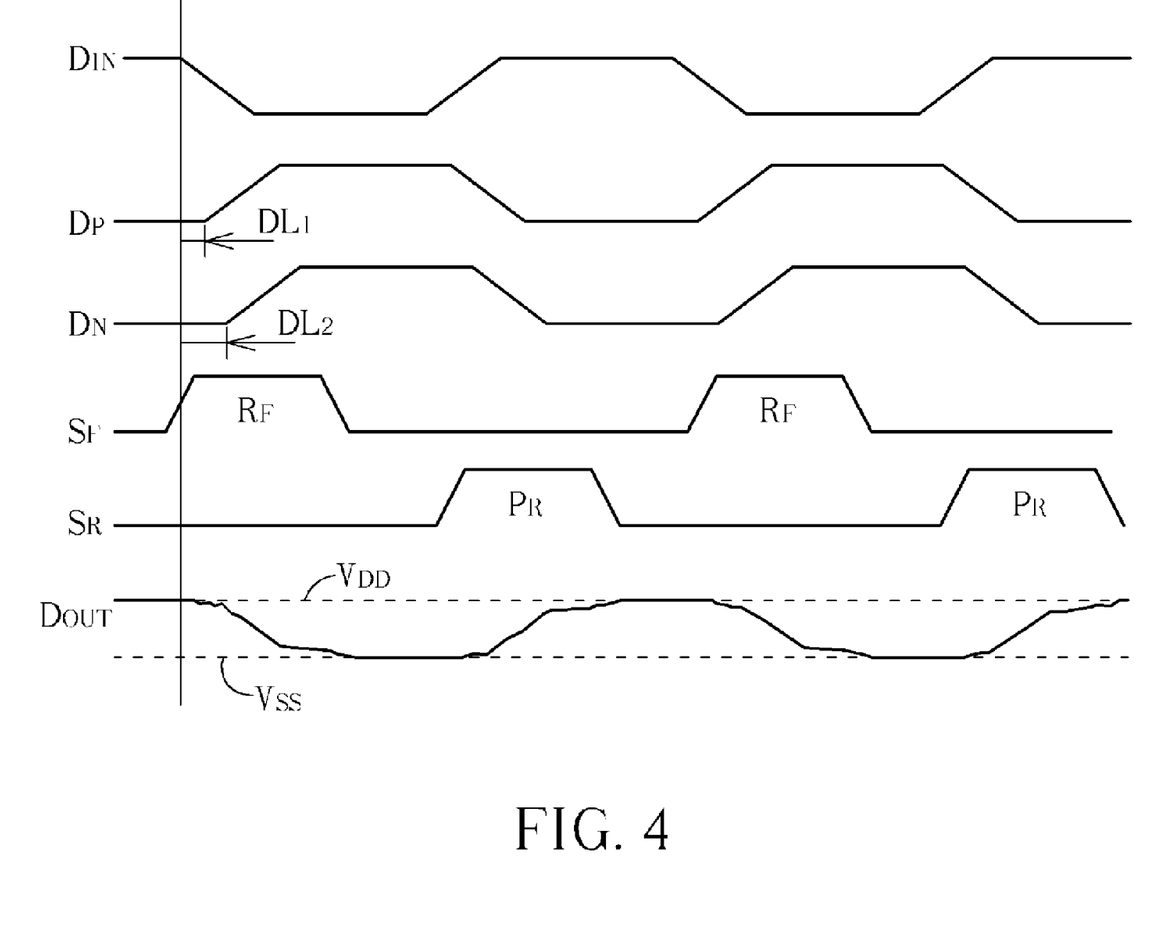
FIG. 4 is a timing diagram illustrating the output circuit of the present invention.

Please refer to FIG. 4. FIG. 4 is a timing diagram illustrating the output circuit 300 of the present invention. As shown in FIG. 4, after the input signal $D_{IN}$ is inputted, on the node $D_P$, the signal inverted from the input signal $D_{IN}$ and delayed for the predetermined period $DL_1$ is generated and inputted to the PMOS $Q_{P1}$. Meanwhile, on the node $D_N$, the signal inverted from the input signal $D_{IN}$ and delayed for the predetermined period $DL_2$ is generated and inputted to the NMOS $Q_{N1}$.

In one embodiment of the present invention, when the input signal $D_{IN}$ falls from the high voltage to the low voltage, the falling-edge trigger circuit 301 generates the pulse signal $P_F$ on the node $S_F$ for turning on the switch $SW_1$ so as to allow the output signal $D_{OUT}$ to receive the voltage $V_1$. After the switch $SW_1$ is turned on, the inverted inputted signal $D_{IN}$ turns on the NMOS $Q_{N1}$. In this way, the voltage difference between the first end and the second end of the NMOS $Q_{N1}$ reduces to ($V_1$—$V_{SS}$) and the overshoot is consequently reduced. When the input signal $D_{IN}$ rises from the low voltage to the high voltage, the rising-edge trigger circuit 302 generates the pulse signal $P_R$ on the node $S_R$ for turning on the switch $SW_2$ so as to allow the output signal $D_{OUT}$ to receive the voltage $V_2$. After the switch $SW_2$ is turned on, the inverted inputted signal $D_{IN}$ turns on the PMOS $Q_{P1}$. In this way, the voltage difference between the first end and the second end of the PMOS $Q_{P1}$ reduces to ($V_{DD}$–$V_2$) and the overshoot is consequently reduced.

Figure 5:
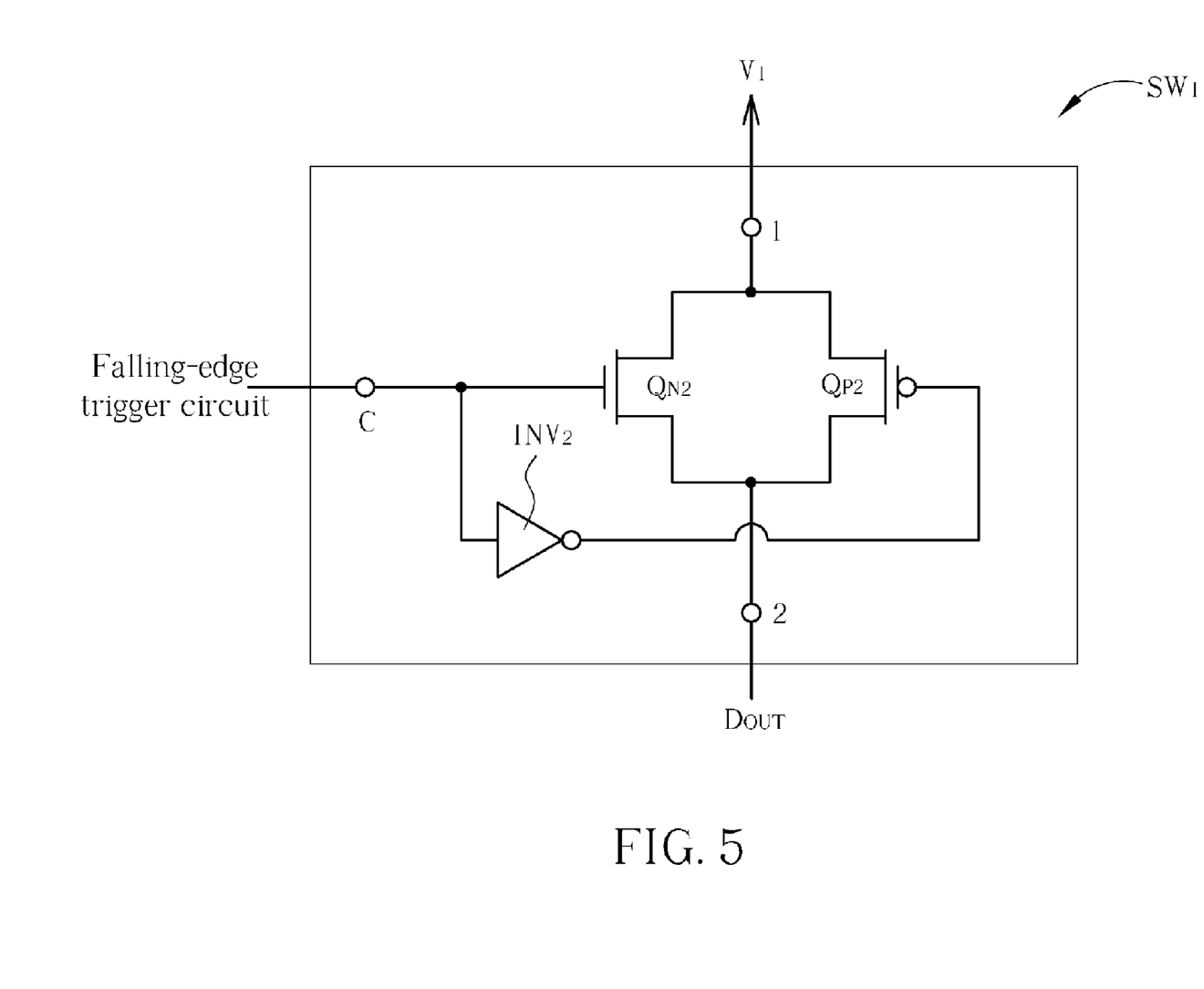
FIG. 5 is a diagram illustrating one switch of the present invention.
Figure 7:
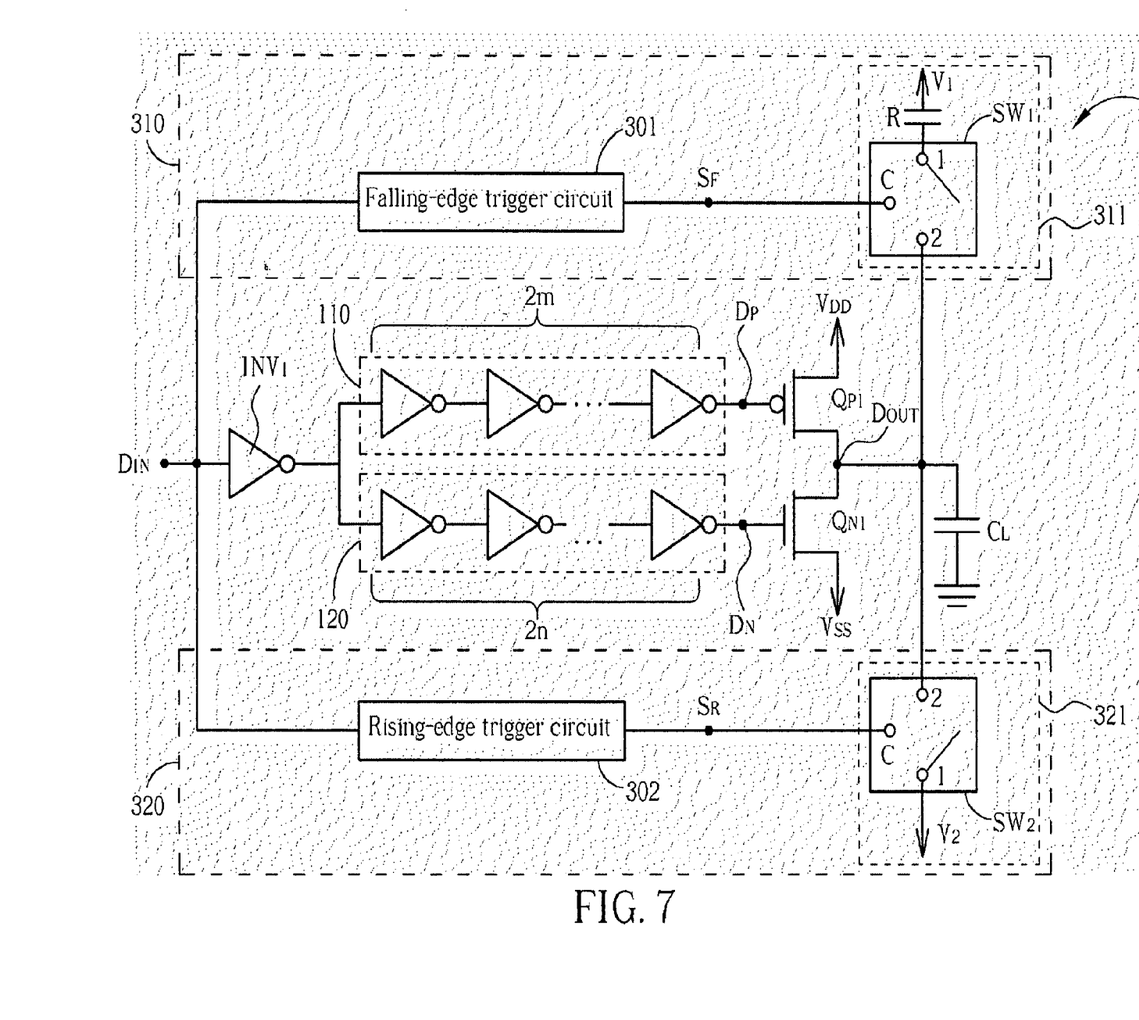
FIG. 7 is a diagram illustrating the output circuit with a terminal resistor of the present invention.

Please refer to FIG. 5. FIG. 5 is a diagram illustrating the switch $SW_1$ of the present invention. As shown in FIG. 5, the switch $SW_1$ comprises an inverter $INV_2$, a PMOS $Q_{P2}$ and an NMOS $Q_{N2}$. The PMOS $Q_{P2}$ comprises a first end, a second end, and a third end. The NMOS $Q_{N2}$ comprises a first end, a second end, and a third end. The inverter $INV_2$ comprises an input end and an output end. The input end of the inverter $INV_2$ is coupled to the control end C of the switch $SW_1$ for receiving the pulse signal $P_F$ transmitted from the falling-edge trigger circuit 301, and the inverter $INV_2$ accordingly generates the inverted pulse signal $P_F$. The first end of the PMOS $Q_{P2}$ is coupled to the first end of the switch $SW_1$ for coupling to the voltage source $V_1$. The second end of the PMOS $Q_{P2}$ is coupled to the second end of the switch $SW_1$ for coupling to the output end of the output circuit 300. The control end of the PMOS $Q_{P2}$ is coupled to the output end of the inverter $INV_2$ for receiving the inverted pulse signal $P_F$. When the PMOS $Q_{P2}$ receives the inverted pulse signal $P_F$, the first end of the PMOS $Q_{P2}$ is coupled to the second end of the PMOS $Q_{P2}$ for transmitting the voltage $V_1$ to the output end of the output circuit 300. The first end of the NMOS $Q_{N2}$ is coupled to the first end of the switch $SW_1$ for coupling to the voltage source $V_1$. The second end of the NMOS $Q_{N2}$ is coupled to the second end of the switch $SW_1$ for coupling to the output end of the output circuit 300. The control end of the NMOS $Q_{N2}$ is coupled to the control end C of the switch $SW_1$ for receiving the pulse signal $P_F$. When the NMOS $Q_{N2}$ receives the pulse signal $P_F$, the first end of the NMOS $Q_{N2}$ is coupled to the second end of the NMOS $Q_{N2}$ for transmitting the voltage $V_1$ to the output end of the output circuit 300. In another embodiment of the present invention as shown in FIG. 7, a terminated resistor can be disposed between the first end of the switch $SW_1$ and the voltage source $V_1$ for increasing the integrity of the signal. The terminated resistor can be a normal resistor or a MOS resistor; for instances, FIG. 7 illustrates the output circuit of the present invention for which a resistor R is utilized as the terminal resistor and the resistor R is coupled between the first end of the switch $SW_1$ and the voltage source $V_1$.

Figure 6:
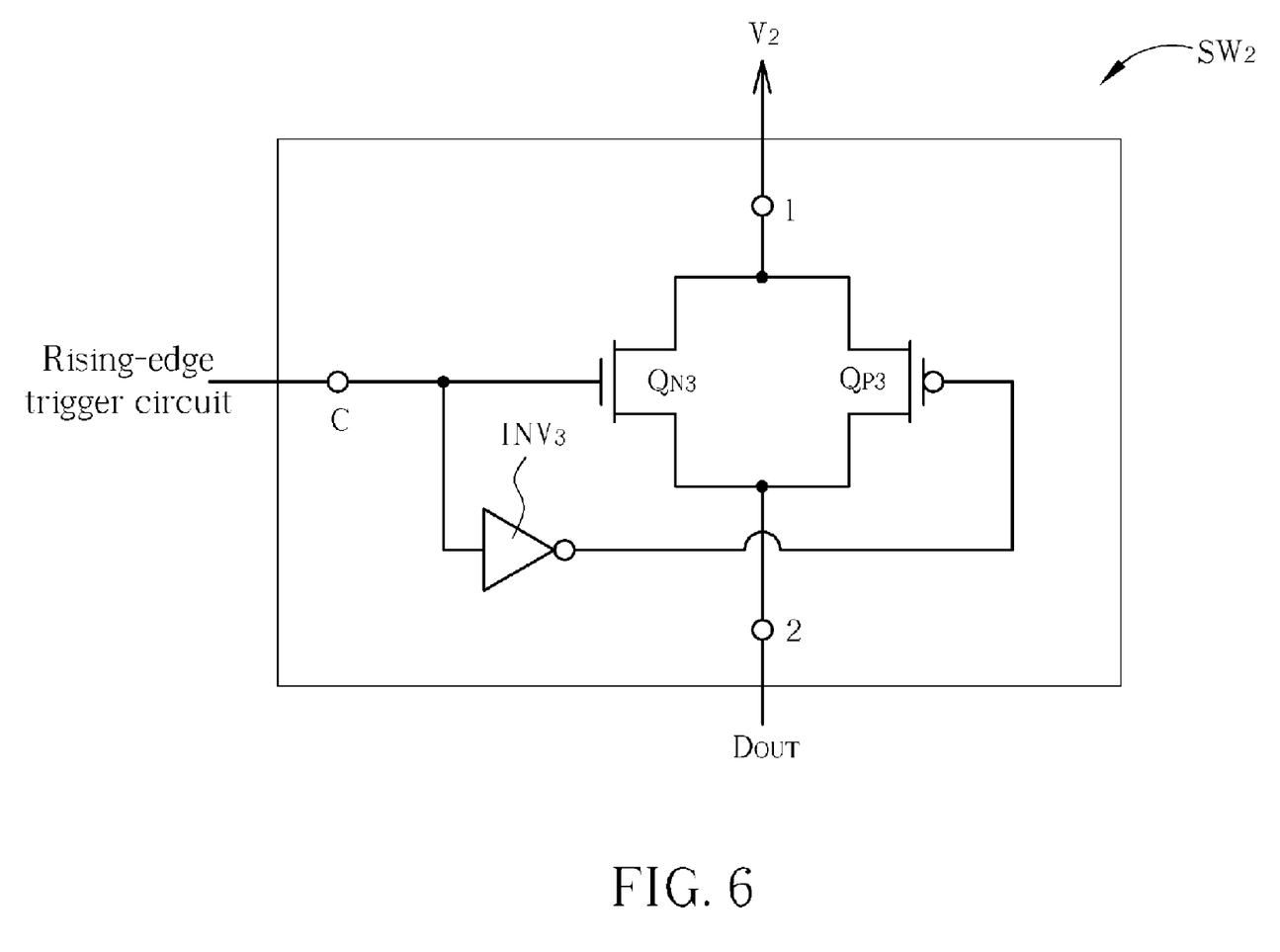
FIG. 6 is a diagram illustrating another switch of the present invention.

Please refer to FIG. 6. FIG. 6 is a diagram illustrating the switch $SW_2$ of the present invention. As shown in FIG. 6, the switch $SW_2$ comprises an inverter $INV_3$, a PMOS $Q_{P3}$ and an NMOS $Q_{N3}$. The PMOS $Q_{P3}$ comprises a first end, a second end, and a third end. The NMOS $Q_{N3}$ comprises a first end, a second end, and a third end. The inverter $INV_3$ comprises an input end and an output end. The input end of the inverter $INV_3$ is coupled to the control end C of the switch $SW_2$ for receiving the pulse signal $P_R$ transmitted from the rising-edge trigger circuit 302, and the inverter $INV_3$ accordingly generates the inverted pulse signal $P_R$. The first end of the PMOS $Q_{P3}$ is coupled to the first end of the switch $SW_2$ for coupling to the voltage source $V_2$. The second end of the PMOS $Q_{P3}$ is coupled to the second end of the switch $SW_2$ for coupling to the output end of the output circuit 300. The control end of the PMOS $Q_{P3}$ is coupled to the output end of the inverter $INV_3$ for receiving the inverted pulse signal $P_R$. When the PMOS $Q_{P3}$ receives the inverted pulse signal $P_R$, the first end of the PMOS $Q_{P3}$ is coupled to the second end of the PMOS $Q_{P3}$ for transmitting the voltage $V_2$ to the output end of the output circuit 300. The first end of the NMOS $Q_{N3}$ is coupled to the first end of the switch $SW_2$ for coupling to the voltage source $V_2$. The second end of the NMOS $Q_{N3}$ is coupled to the second end of the switch $SW_2$ for coupling to the output end of the output circuit 300. The control end of the NMOS $Q_{N3}$ is coupled to the control end C of the switch $SW_2$ for receiving the pulse signal $P_R$. When the NMOS $Q_{N3}$ receives the pulse signal $P_R$, the first end of the NMOS $Q_{N3}$ is coupled to the second end of the NMOS $Q_{N3}$ for transmitting the voltage $V_2$ to the output end of the output circuit 300. In another embodiment of the present invention, a terminated resistor can be disposed between the first end of the switch $SW_2$ and the voltage source $V_2$ for increasing the integrity of the signal. The terminated resistor can be a normal resistor or a MOS resistor.

To sum up, the output circuit provided by the present invention, with the falling-edge trigger circuit, rising-edge trigger circuit, and voltage sources, reduces the overshoot problem on the output signal so as to reduce the damage to the components, which provides great convenience.

Those skilled in the art will readily observe that numerous modifications and alterations of the device and method may be made while retaining the teachings of the invention.

What is claimed is:

1. An output circuit with overshoot-reducing function, the output circuit comprising:
   an input end for receiving an input signal;
   an output end;
   a PMOS comprising:
      a first end coupled to a first voltage source supplying a first voltage;
      a control end coupled to the input end; and
      a second end directly coupled to the output end;
   an NMOS comprising:
      a first end coupled to a second voltage source supplying a second voltage;
      a control end coupled to the input end; and
      a second end directly coupled to the output end;
   a rising-edge trigger biasing circuit coupled between the input end and the output end for outputting a third voltage to the output end so as to reduce overshoot on the output end according to a rising edge of the input signal, the rising-edge trigger biasing circuit comprising:
      a rising-edge trigger circuit coupled to the input end for generating a pulse signal with a predetermined period according to the rising edge of the input signal; and
      a biasing circuit coupled between the output end and the rising-edge trigger circuit for providing the third voltage to the output end according to the pulse signal generated by the rising-edge trigger circuit, the biasing circuit of the rising-edge trigger biasing circuit comprising:
         a third voltage source for supplying the third voltage; and
         a second switch comprising a first end directly coupled to the third voltage source, a control end coupled to the rising-edge trigger circuit for receiving the pulse signal generated by the rising-edge trigger circuit, and a second end directly coupled to the output end for coupling the third voltage source to the output end according to the pulse signal generated by the rising-edge trigger circuit;
   a falling-edge trigger biasing circuit coupled between the input end and the output end for outputting a fourth voltage to the output end so as to reduce overshoot on the output end according to a falling edge of the input signal, the falling-edge trigger biasing circuit comprising:
      a falling-edge trigger circuit coupled to the input end for generating a pulse signal with a predetermined period according to the falling edge of the input signal; and
      a biasing circuit coupled between the output end and the falling-edge trigger circuit for providing the fourth voltage to the output end according to the pulse signal generated by the falling-edge trigger circuit, the biasing circuit of the falling-edge trigger biasing circuit comprising:
         a fourth voltage source for supplying the fourth voltage; and
         a first switch comprising a first end directly coupled to the fourth voltage source, a control end coupled to the falling-edge trigger circuit for receiving the pulse signal generated by the falling-edge trigger circuit, and a second end directly coupled to the output end for coupling the fourth voltage source to the output end according to the pulse signal generated by the falling-edge trigger circuit;
   an inverter coupled to the input end for generating an inverted input signal according to the input signal;
   a first delay circuit coupled between the inverter and the control end of the PMOS for delaying the inverted input signal for a first predetermined period; and
   a second delay circuit coupled between the inverter and the control end of the NMOS for delaying the inverted input signal for a second predetermined period;
   wherein the second predetermined period is different from the first predetermined period;
   wherein the third voltage is higher than the second voltage, and the fourth voltage is lower than the first voltage.

2. The output circuit of claim 1, wherein the third voltage is between average of the first voltage and the second voltage and the second voltage, and the fourth voltage is between average of the first voltage and the second voltage and the first voltage.

3. The output circuit of claim 1, wherein the PMOS is turned on for enabling the output end to couple to the first voltage source only after the switch is turned on for a predetermined period.

4. The output circuit of claim 1, wherein the biasing circuit of the rising-edge trigger biasing circuit further comprises a terminated resistor coupled between the third voltage source and the second switch.

5. The output circuit of claim 1, wherein the second switch is an NMOS, the biasing circuit of the rising-edge trigger biasing circuit further comprising:
   an inverter coupled to the rising-edge trigger circuit for receiving the pulse signal generated by the rising-edge trigger circuit and accordingly generating an inverted pulse signal; and
   a PMOS comprising:
      a first end coupled to the third voltage source;
      a control end coupled to the inverter for receiving the inverted pulse signal; and
      a second end coupled to the output end for coupling the third voltage source to the output end according to the inverted pulse signal.

6. The output circuit of claim 1, wherein the NMOS is turned on for enabling the output end to couple to the second voltage source only after the switch is turned on for a predetermined period.

7. The output circuit of claim 1, wherein the biasing circuit of the falling-edge trigger biasing circuit further comprises a terminated resistor coupled between the fourth voltage source and the first switch.

8. The output circuit of claim 1, wherein the first switch is an NMOS, the biasing circuit of the falling-edge trigger biasing circuit further comprising:
   an inverter coupled to the falling-edge trigger circuit for receiving the pulse signal generated by the falling-edge trigger circuit and accordingly generating an inverted pulse signal; and
   a PMOS comprising:
      a first end coupled to the fourth voltage source;
      a control end coupled to the inverter for receiving the inverted pulse signal; and
      a second end coupled to the output end for coupling the fourth voltage source to the output end according to the inverted pulse signal.

9. The output circuit of claim 1, wherein the first delay circuit comprises N inverters, the second delay circuit comprises M inverters, N and M are even numbers, and N is different from M.

* * * * *